(12) United States Patent
Melanson

(10) Patent No.: US 7,365,669 B1
(45) Date of Patent: Apr. 29, 2008

(54) LOW-DELAY SIGNAL PROCESSING BASED ON HIGHLY OVERSAMPLED DIGITAL PROCESSING

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/692,906

(22) Filed: Mar. 28, 2007

(51) Int. Cl.
*H03M 3/00* (2006.01)

(52) U.S. Cl. ............................. 341/143; 381/312

(58) Field of Classification Search ............... 341/143, 341/144, 155; 381/312
See application file for complete search history.

(56) References Cited

U.S. PATENT DOCUMENTS

| 5,241,310 A | * | 8/1993 | Tiemann | ............... 341/143 |
| 6,249,237 B1 | * | 6/2001 | Prater | ............... 341/143 |
| 6,937,738 B2 | * | 8/2005 | Armstrong et al. | ........ 381/312 |

* cited by examiner

*Primary Examiner*—Jean B Jeanglaude
(74) *Attorney, Agent, or Firm*—Davis Chin; Steven Lin; Gregory S. Thomas

(57) ABSTRACT

A low-delay signal processing system and method are provided which includes a delta-sigma analog-to-digital converter, an oversampling processor, and a delta-sigma digital-to-analog converter. The delta-sigma analog-to-digital converter receives an input or audio signal and generates a digital sample signal at a high oversampling rate. The oversampling processor is connected to the analog-to-digital converter for processing the digital sample signal at the high oversampling rate with low-delay. The delta-sigma digital-to-analog converter is connected to the oversampling processor for receiving the digital sample signal at the high oversampling rate with low-delay for generating an analog signal. The oversampling processor includes a low-delay filter and a programmable delay element. In this manner, the analog signal is produced with a low delay and high accuracy.

25 Claims, 9 Drawing Sheets

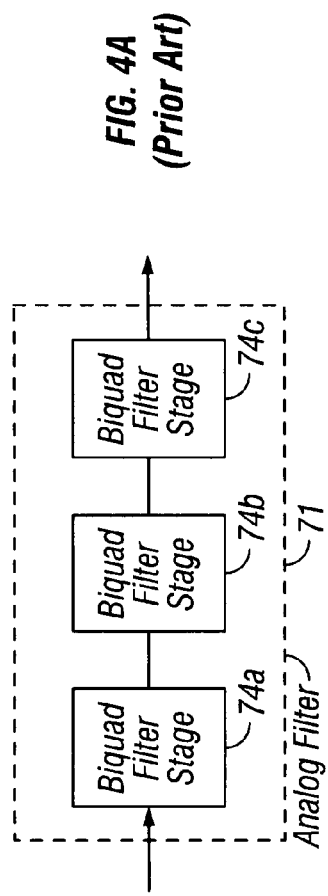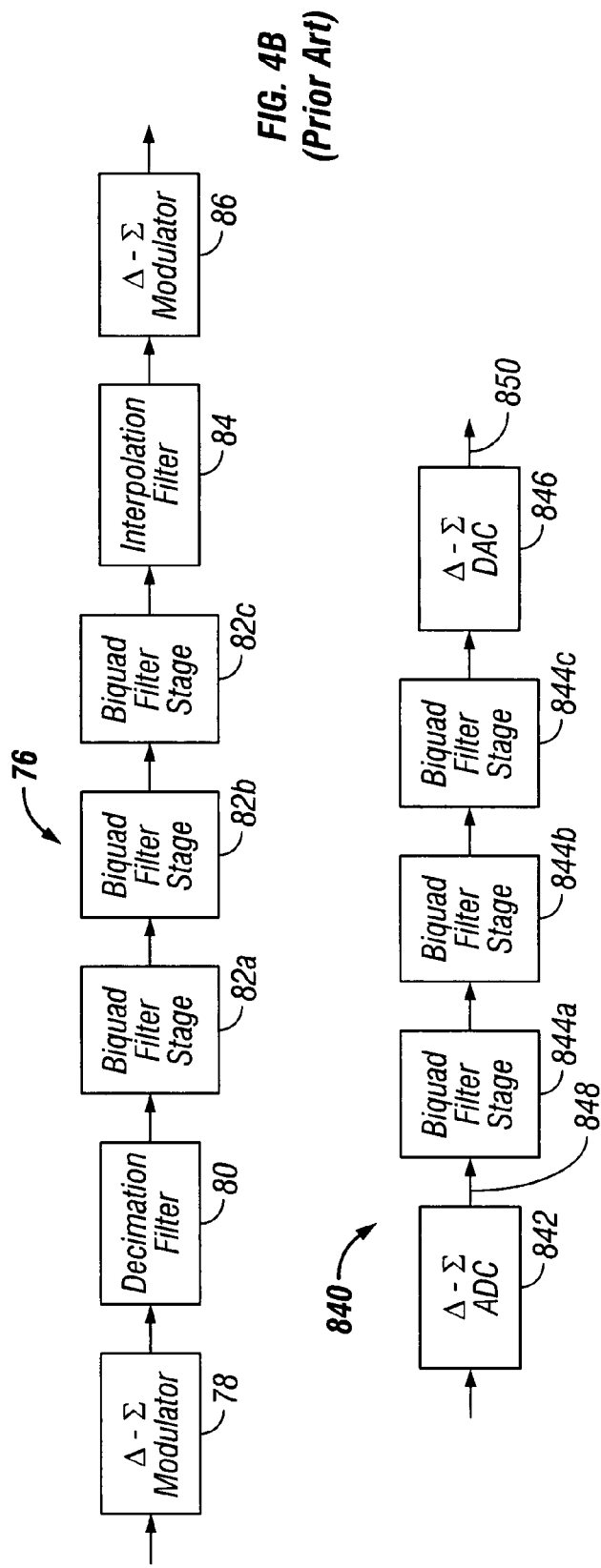
FIG. 4A (Prior Art)
FIG. 4B (Prior Art)
FIG. 8A

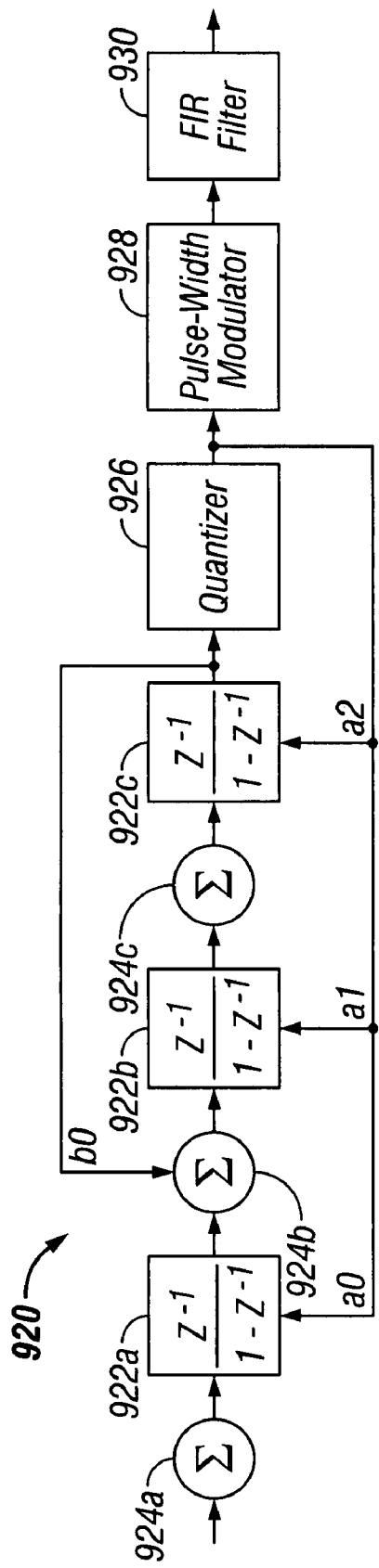
FIG. 10
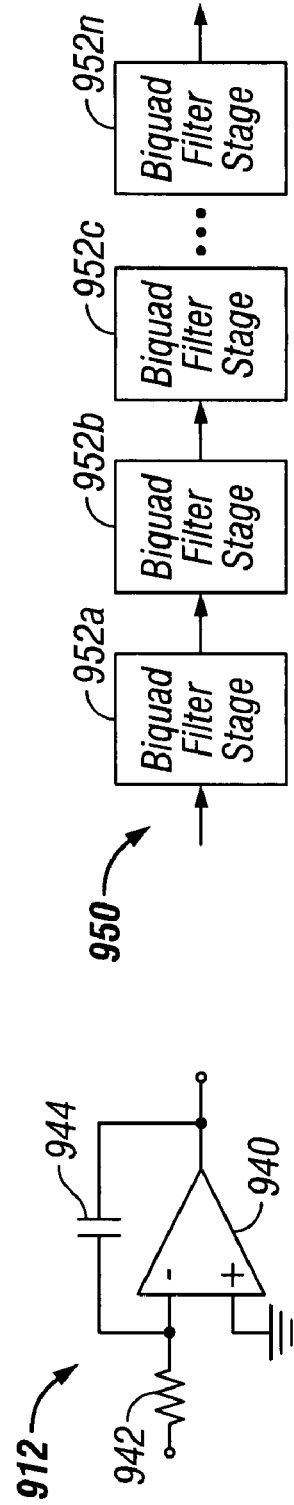
FIG. 12
FIG. 11

LOW-DELAY SIGNAL PROCESSING BASED ON HIGHLY OVERSAMPLED DIGITAL PROCESSING

BACKGROUND OF THE INVENTION

1. Field of the Invention

The invention relates generally to signal processing apparatuses and methods. More particularly, it relates to a low-delay signal processing system and method which are based on highly oversampled digital processing so as to achieve low throughput delay.

2. Description of the Prior Art

As is generally known to those skilled in the art, audio filtering with low delay has been performed traditionally in an analog domain (i.e., analog signal processing). However, analog signal processing (audio filtering) suffers from a number of drawbacks. For example, one problem is the difficulty of implementing analog filter components with high precision or accuracy. In other words, analog filtering requires the use of components that generally cannot be closely matched, especially in integrated analog filters. Further, analog filter circuits are susceptible to signal drift and to environmental noise build-up, especially when a high-order analog filter system is implemented.

In addition, analog filter circuits can consume a large amount of power when the noise must be kept low. Also, these circuits have the disadvantage of being difficult in maintaining high linearity. Nevertheless, analog signal processing is still often used in applications where filtering is required with a minimum delay. Such filters are used in real-time control systems for active noise cancellation or feedback cancellation applications.

For example, one application for low-delay signal processing where active feedback cancellation is used is in a hearing aid system 10, as illustrated in FIG. 1A. The hearing aid system 10 includes a speaker 12 disposed into the ear 14 and a microphone 16 arranged on the outside of the hearing aid 18. There exists an acoustic path along line 20 having leakage around the hearing aid 18 from the speaker 12 back to the microphone 16. This leakage causes the hearing aid to have feedback which creates a howling or "whistling" sound. This "whistling" when it occurs can be eliminated by canceling or subtracting out electronically with a model of the feedback path. This feedback path is desired to be very fast. Thus, the present invention would be useful in providing a feedback path with low delay so as to avoid any howling.

FIG. 1B shows a simplified block diagram of the hearing aid system 10 of FIG. 1A, which utilizes the present invention. The hearing aid system 10 includes signal processing feedback cancellation block 22, which is designed to model the transfer function of the feedback path in order to cancel out the acoustic leakage inherent in the system. A summer 24 subtracts a feedback path model signal 26, which represents the acoustic leakage of the system 10, from the audio input on line 28 coming from the microphone 16. The difference signal 30 is then processed by the audio signal processor block 32 and generates an audio output signal 34 to the speaker 12. The audio output signal 34 is also fed back to the feedback cancellation block 22.

FIG. 2 is a more detailed block diagram of the hearing aid system 10 of FIG. 1B. The hearing aid system 10 includes a delta-sigma modulator 36 having its input connected to receive the analog audio signal from the microphone 16 and having its output connected to a first input of the summer 24. The output of the summer 24 is fed to a decimation filter 38 having an output that is connected to a digital signal processor block 39. The output of the digital signal processor block 39 is fed to an interpolation filter 40 which has an output that is connected to a delta-sigma modulator 42. The output of the modulator 42 is connected to the speaker 12.

The signal processing feedback cancellation block 22 includes an oversampled model block 44 of the hearing aid and an adjustable delay block 46. The output of the interpolation filter 40 is connected to the input of the oversampled model block 44. The output of the block 44 is fed to the second input of the summer 24 via the adjustable delay block 46.

Another application of where active noise cancellation is used is in a headphone system 48, as depicted in FIG. 3. The headphone system 48 includes an earpiece 50 (only one being shown) which has a speaker 52 aimed at an ear 54 and a microphone 56 arranged on the outside of the earpiece. There exists an acoustic path along line 58 having leakage around the earpiece 50. The headphone system uses noise cancellation of the feedforward type so as to reduce the noise heard by the user wearing the headphone. This noise cancellation is achieved through modeling the feedforward path by placing a microphone on the outside of an earpiece. A compensating signal, which is the same amplitude as the leakage but opposite in phase, is then inserted so as to cancel out the noise.

FIG. 4 is a block diagram of the feedforward headphone system 48 of FIG. 3. The headphone system 48 includes a delta-sigma modulator 60 having its input connected to receive the analog input signal from the microphone 56 and having its output connected to a decimation filter 62. The output of the decimation filter 62 if fed to a record operation block 64. At the same time, a play operation block 66 has its output connected to an interpolation filter 68 which has an output that is connected to a delta-sigma modulator 72 having an output that is connected to the speaker 52. An analog filter 61 of the headphone system is also connected to the output of the microphone 56. The output of the analog filter 61 is also fed to the speaker 52. The analog filter 61 cannot be connected after the decimation filter 62 and before the interpolation filter 68 due to the delay that would be encountered. As a result, the analog filter 61 is interconnected before the input of the decimation filter 62 and after the output of the interpolation filter 68. The analog filter 61 is formed of Resistor-Capacitor (RC) elements and its adjustments thereof consume a large amount of power. Optionally, the delta-sigma modulator 60, decimation filter 62 and record operation block 64 shown within the dotted line 65 would be omitted for the case of a play-only system.

In FIG. 4A, there is shown a prior art analog filter 71 for use in noise cancellation applications. The analog filter 71 is formed of a plurality of series-connected biquad filter stages 74a-74c. The biquad filter stages suffer from the disadvantage of consuming a large amount of power. Further, the biquad filter stages are difficult to accurately set and require the use of large capacitors.

In FIG. 4B, there is shown a block diagram of a prior art digital processing system 76 for use in noise cancellation applications. The digital processing system includes a delta-sigma modulator 78 having its output connected to a decimation filter 80. The output of the decimation filter is connected to a plurality of series-connected biquad filter stages 82a-82c. The output of the filter stage 82c is fed to an interpolation filter 84 having an output that is connected to a delta-sigma modulator 86. Since all of the biquad filter stages 82a-82c are being operated at a low sampling rate, they are relatively easy to set accurately and use a small amount of power. However, they suffer from the drawback of having large delays due to the inherent delays in the decimation and interpolation filters. As a result, this prior art digital processing system is generally not very useful in many real-time applications where a low delay is desired.

Still another application of where noise cancellation (feedback) is used is in a headphone system 510, as shown in FIG. 5. The feedback headphone system 510 is substantially identical to the headphone system 48 of FIG. 3, except the microphone 576 is located on the inside of the earpiece 578. Noise cancellation (feedback) is provided so as to cancel the leakage signal from the speaker 580 to the microphone 576. In this case, it is even more critical that the delay be minimized so as to avoid causing system instability, thereby producing oscillations.

Still yet another application of where noise cancellation is used is in an active control system 610 of acoustic energy from a noise-producing machinery, as depicted in FIG. 6. Noise cancellation is utilized to cancel the rumbling noise coming from the speaker 682 in the air duct system 684. Again, in order to provide loop stability, there must not be any delays. A compensating signal from the speaker 682 but opposite in phase to the noise coming down the air duct is used to produce noise cancellation. The noise is inputted to the microphone 686.

Yet still another application of where noise cancellation is used is in a motor control system 710, as shown in FIG. 7. The motor control system 710 includes a power amplifier 712 and a motor 714. In the feedback path, there are provided a mechanical system 716 for a position motor, a position sensor 718, and a compensating on filter 720 (analog). A summer 722 subtracts the compensating signal 724 from the input signal 726 and generates an error signal 728 for driving the power amplifier 712 in order to control the motor 714.

However, modern control systems have now been implemented with digital filters rather than analog filters. There are inherent delays that are associated with digital type filters. Therefore, there is a need to provide signal processing in the digital domain, but yet realizes low delays for use in noise cancellation applications of the feedforward or feedback type. Unfortunately, conventional digital signal processing has been found to be inappropriate for real-time applications due to the fact that they are based on relatively slow sequential signal processing.

Recognizing the drawbacks of the analog signal processing discussed above and the unacceptable use of conventional digital signal processing for real-time applications, it would be desirable to provide a low-delay signal processing system which is based on highly oversampled digital processing.

SUMMARY OF THE INVENTION

Accordingly, it is a general object of the present invention to provide a low-delay signal processing system and method for use in a feedforward/feedback headphone system which overcomes all of the disadvantages of the prior art.

It is an object of the present invention to provide a low-delay signal processing system and method for use in a feedforward/feedback headphone system so as to reduce "whistling" when it occurs.

It is another object of the present invention to provide a low-delay signal processing system and method for use in a feedback hearing aid system so as to reduce "whistling" when it occurs.

It is still another object of the present invention to provide a signal processing system which includes an oversampling filter with low delay which is performed in a digital domain.

It is yet still another object of the present invention to provide a low-delay signal processing system which is based upon highly oversampled digital processing.

In a preferred embodiment of the present invention, there is provided a low-delay signal processing system which includes a delta-sigma analog-to-digital converter, an oversampling processor, and a delta-sigma digital-to-analog converter. The delta-sigma analog-to-digital converter receives an input signal and generates a digital sample signal at a high oversampling rate. The oversampling processor is connected to the analog-to-digital converter for processing the digital sample signal at the high oversampling rate with low-delay.

The delta-sigma digital-to-analog converter is connected to the oversampling processor for receiving the digital sample signal at the high oversampling rate with low-delay for generating an analog signal. The oversampling processor includes a low-delay filter and a programmable delay element. In this manner, the analog signal is produced with a low delay and high accuracy.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 4A is a block diagram of a prior art implementation of an analog filter for use in noise cancellation;

FIG. 4B is a block diagram of a prior art digital processing system for use in noise cancellation applications;

FIG. 8A is a block diagram of a second embodiment of a low-delay digital processing system of the present invention for use in noise cancellation applications;

FIG. 10 is a block diagram of a preferred embodiment of a digital-to-analog converter suitable for use in the delta-sigma digital-to-analog converter of FIG. 8;

FIG. 11 is schematic diagram of an implementation of the integrators of FIG. 9;

FIG. 12 is a block diagram of a low-delay filter formed of biquad filter stages suitable for use in FIG. 8.

DESCRIPTION OF THE PREFERRED EMBODIMENTS

Figure 1A:
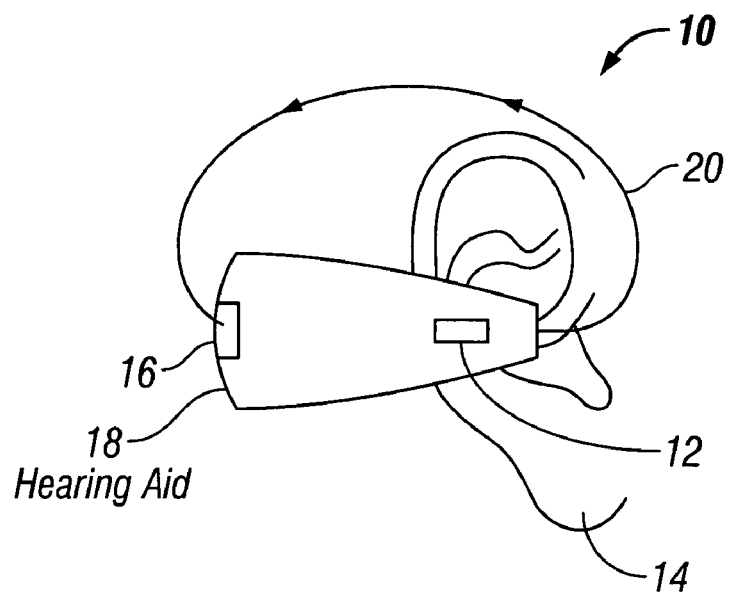
FIG. 1A is a pictorial representation of a hearing aid system 10, illustrating the use of noise cancellation (feedback)
Figure 1B:
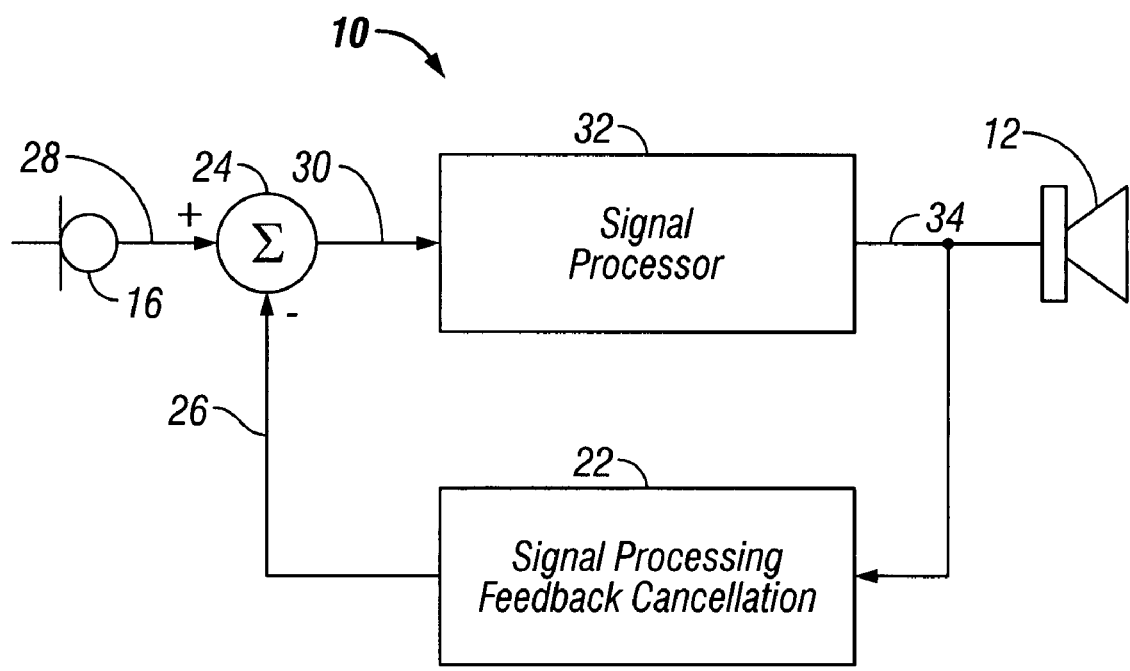
FIG. 1B is a simplified block diagram implementation of the hearing aid system 10 of FIG. 1A.
Figure 2:
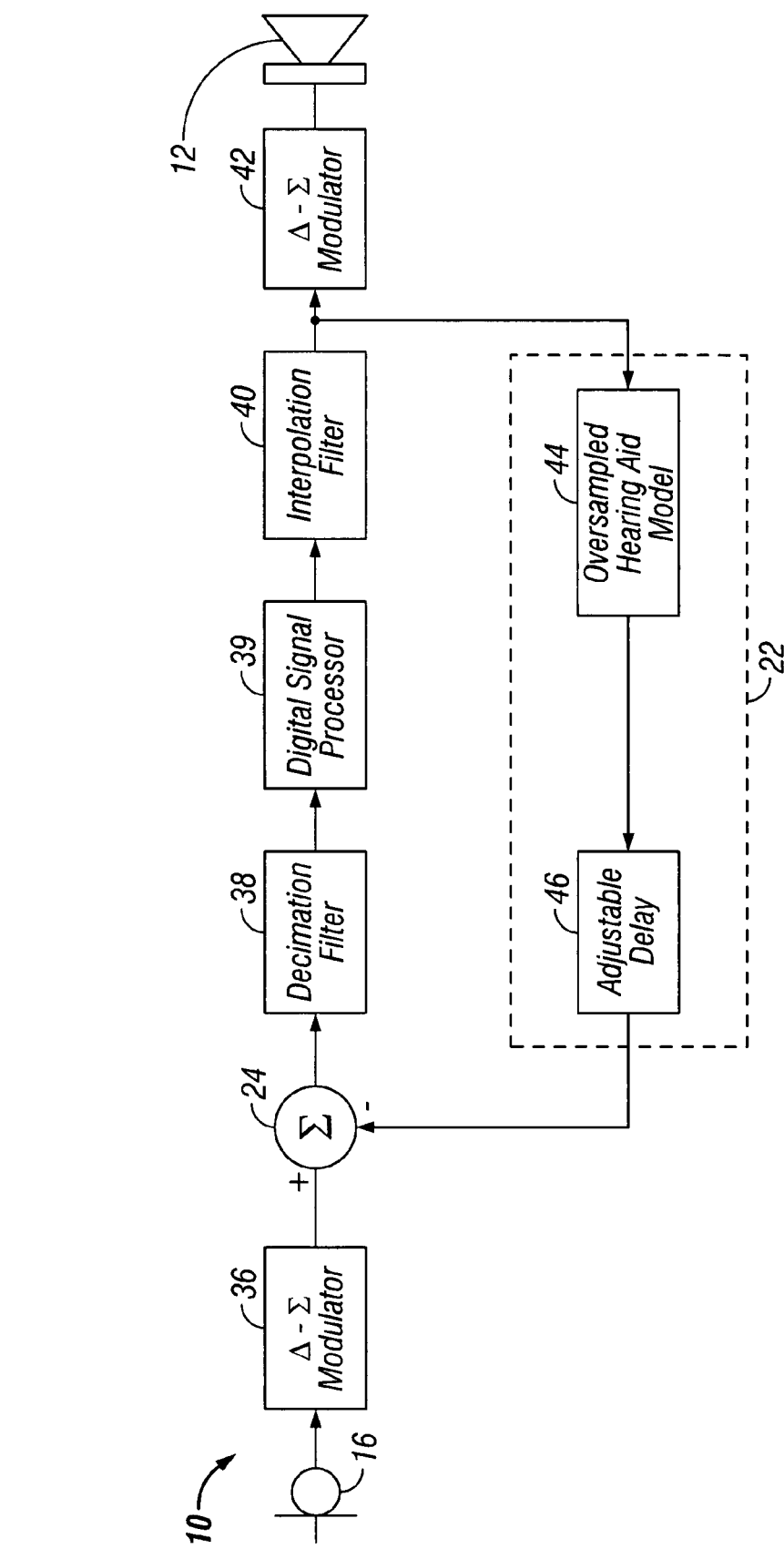
FIG. 2 is a more detailed electronic implementation of the hearing aid system 10 of FIG. 1B.
Figure 3:
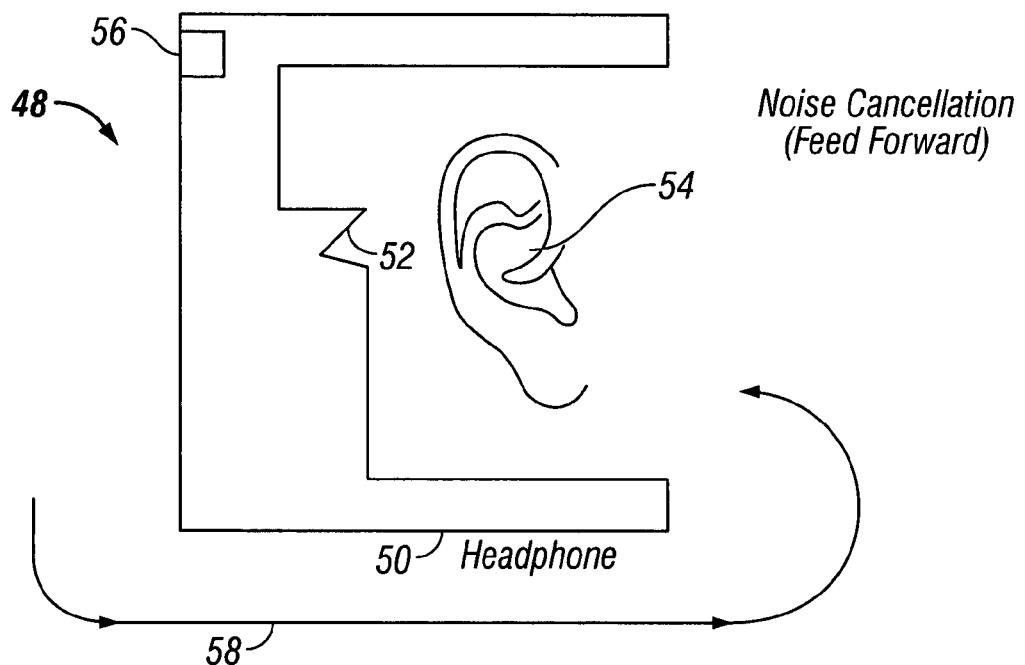
FIG. 3 is a pictorial representation of a headphone system 48, illustrating the use of noise cancellation (feedforward)
Figure 5:
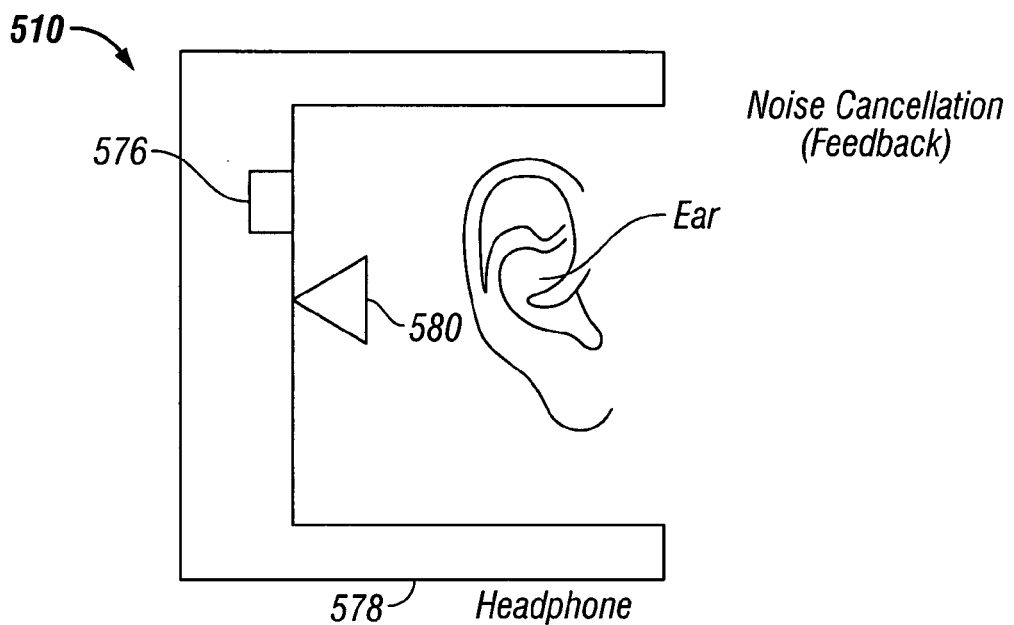
FIG. 5 is a pictorial representation of a headphone system 510, illustrating the use of noise cancellation (feedback)

It is to be distinctly understood at the outset that the present invention shown in the drawings and described in detail in conjunction with the preferred embodiments is not intended to serve as a limitation upon the scope or teachings thereof, but is to be considered merely as an exemplification of the principles of the present invention.

Figure 4:
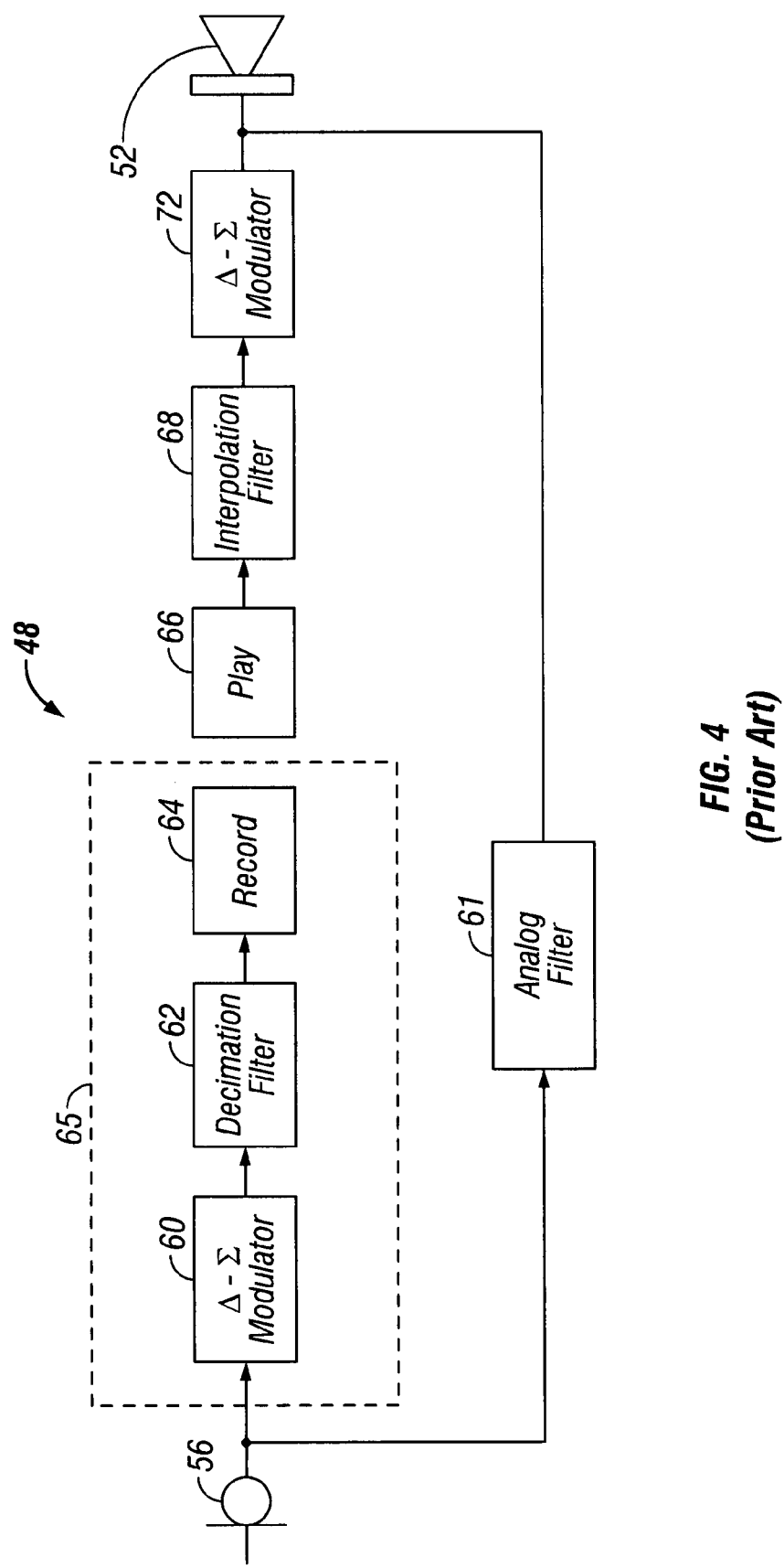
FIG. 4 a block diagram implementation of the headphone system 48 of FIG. 3.
Figure 6:
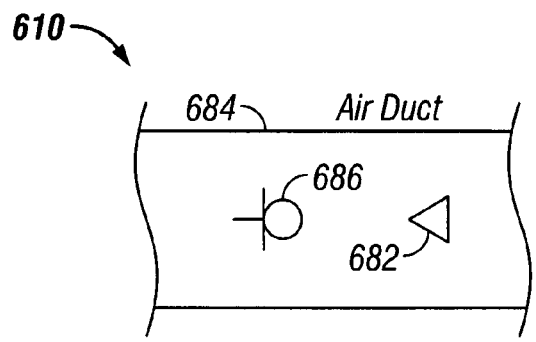
FIG. 6 is a pictorial representation of an active control system 610, illustrating the use of noise cancellation (feedback)
Figure 7:
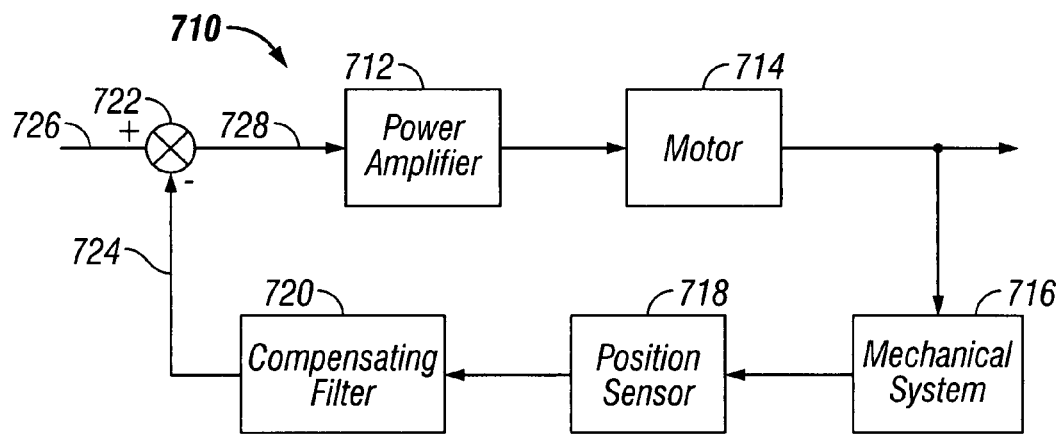
FIG. 7 is a pictorial representation of a motor control system 710, illustrating the use of noise cancellation (feedback)
Figure 8:
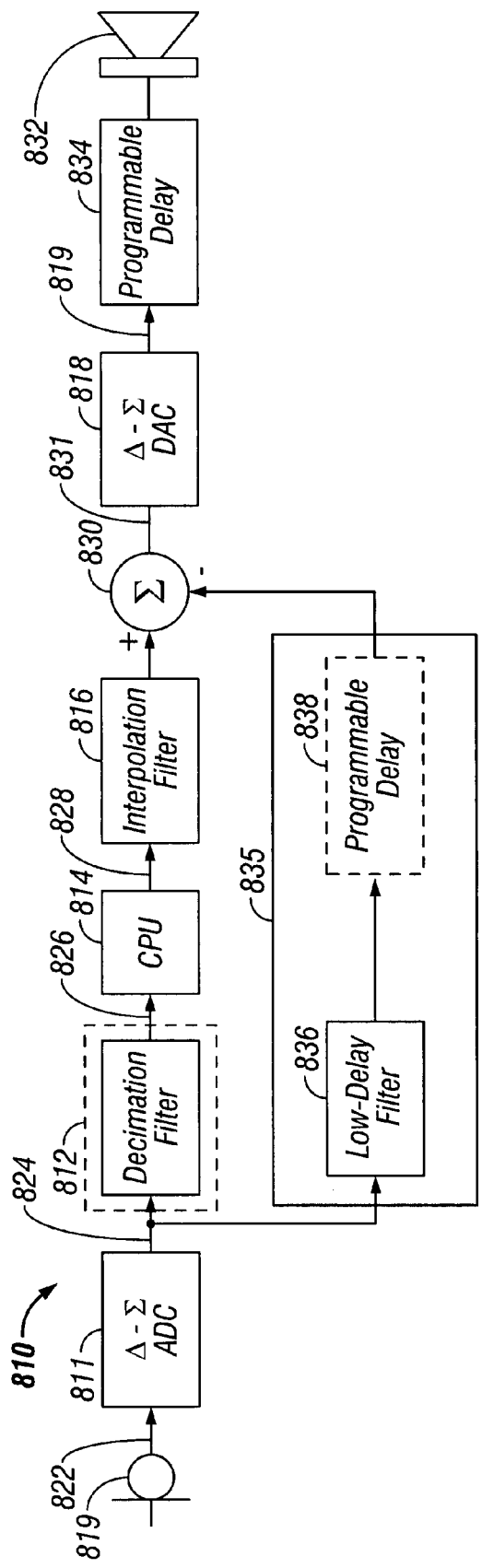
FIG. 8 is a block diagram of a low-delay audio digital processing system 810 for use in a headphone system of the feedforward type, constructed in accordance with the principles of the present invention.

Referring now in detail to FIG. 8 of the drawings, there is depicted a block diagram of a low-delay audio digital processing system 810 for use in a headphone system, constructed in accordance with the principles of the present invention. In particular, the low-delay audio data processing system 810 represents an improvement over the prior art audio signal processing system of FIG. 4 which is performed in the analog domain. The inventor has developed a way of implementing the audio signal processing system of FIG. 4 in a digital domain but yet realizes low delays which have been traditionally unobtainable. While the present invention will be described in conjunction with a feedforward headphone system, it should be apparent to those skilled in the art that the instant invention may be utilized in all of the noise cancellation applications, previously described and illustrated in FIGS. 1-7.

In particular, the low-delay digital processing apparatus 810 includes a delta-sigma analog-to-digital converter (ADC) 811, a decimation filter 812, a DSP 814 such as a CPU, an interpolation filter 816, and a delta-sigma digital-to-analog converter (DAC) 818. Analog audio signals are received by a microphone 819 which converts the acoustic energy into electrical signals. These electrical signals 822 are processed by the delta-sigma ADC 811. The ADC 811 includes a delta-sigma modulator which uses a high-rate oversampling to spread the quantization noise power across the oversampling frequency band. Further, the delta-sigma modulator performs noise shaping by operating as a low-pass filter to the electrical input signals 822 and as a high-pass filter to the ambient noise. Thus, most of the quantization noise power will be shifted out of the signal band.

Assuming, by way of example, that the electrical input signals is at a 48 kHz base rate with a 20 kHz bandwidth, the delta-sigma ADC 811 creates a digital sample signal 824 which has been upsampled by 128 to provide 17 levels (approximately 4 bits). The ADC produces the digital sample signal and is being operated at a 6.144 MHz sample frequency. The digital sample signal is fed to the decimation filter 812 where it is downsampled by 128 to obtain a downsample signal 826 of 48 kHz with a 24-bit resolution. The output of the decimation filter is fed to the DSP (CPU) 814. It should be understood by those skilled in the art that there are many variations on the values of the input signals, the upsample rate, and the downsample rate as may be desired by the user. Further, it should be noted that the decimation filter 812 is omitted for the case of a play-only system.

The DSP performs the data processing on the received downsampled signal 826 and outputs the same on line 828 to the interpolation filter 816. The interpolation filter 816 upsamples the signal on the line 828 by 128 to produce an upsampled signal and then feeds it to a first input of a summer 830. The output of the summer 830 generates a compensated upsampled signal 831 which is connected to the delta-sigma DAC 818 for generating an analog audio signal 819 on its output. This audio signal is used to drive a speaker 832 via a programmable delay block 834.

Since the ADC 811, filter 812, DSP 814, filter 816 and DAC 818 all have inherent time delays that may contribute to a "whistling" sound, these delays must be eliminated. This delay elimination is achieved in the present invention by the addition of a feedforward path from the output of the ADC 811 to the input of the summer 830. This feedforward path includes an oversampled processor 835 formed of a low-delay filter 836 operating at a high sampling rate. Alternatively, the oversampled processor 835 may be formed of the low-delay filter 836 and a second programmable delay block 838.

In this case, the programmable delay block 836 is used in lieu of the programmable delay block 834. The input of the low-delay filter 836 is from the output of the ADC 811. The output of the filter 836 is fed to the input of the programmable delay block 838. The programmable delay block 838 is adjustable so as to compensate for the delays inherent in the blocks 811-818. Thus, the output signal from the filter 836 is delayed by the delay block 838 before its addition to the upsampled signal from the interpolation filter 816.

Figure 9:
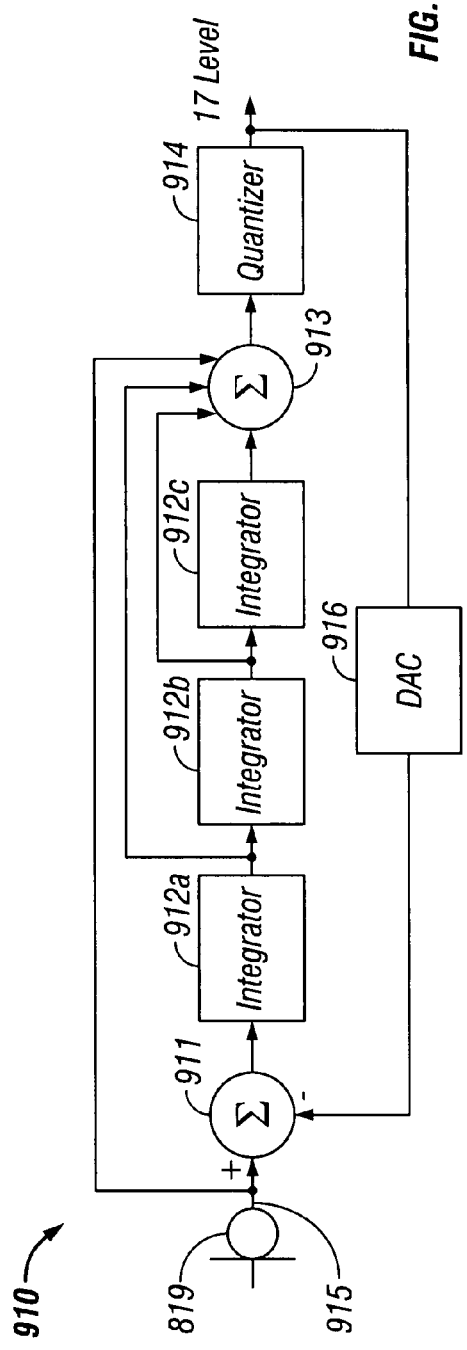
FIG. 9 is an operational block diagram of a preferred embodiment of an analog-to-digital converter for use in the delta-sigma analog-to-digital converter of FIG. 8.

In FIG. 9, there is depicted an operational block diagram of a preferred embodiment of a feedforward ADC 910 suitable for use in the delta-sigma ADC 811 of FIG. 8. The ADC 910 includes a first summer 911, three integrators 912a-912c connected in series, a second summer 913, a quantizer 914, a digital-to-analog converter (DAC) 916. A first input 915 fed to the first summer 911 is from the output of the microphone 819 (FIG. 8) and the outputs of each of the integrators 912a-912c are added by the second summer 913 and is then inputted to the quantizer 914.

The ADC 910 has a constant STF (signal transfer function) of unity gain (i.e., a generally flat response across a wide frequency band) and an all zero NTF (noise transfer function) selected for optimizing the noise shaping response of the quantizer 914. The output of the quantizer provides the 4-bit output and is also fed back to the first summer 911 as a second input via the DAC 916. For a more detailed explanation and discussion of such an ADC 910, reference is made to U.S. Pat. No. 6,670,902, entitled "Delta-Sigma Modulators With Improved Noise Performance" and issued on Dec. 30, 2003, assigned to the same assignee as the present invention, which is hereby incorporated by reference in its entirety.

In FIG. 10, there is depicted an operational block diagram of a preferred embodiment of a delta-sigma DAC 920 suitable for use in the delta-sigma DAC 818 of FIG. 8. The delta-sigma DAC 920 includes delaying integrators 922a-922c, each with a function of $Z^{-1}/1-Z^{-1}$, associated summers 924a-924c, a quantizer 926, a pulse-width modulator (PWM) 928, and a finite impulse response (FIR) filter 930. The output of the quantizer 926 is multiplied by corresponding coefficients a0, a1 and a2 before being fed back to the respective summers 924a-924c. The output of the third delaying integrator 922c is multiplied by a coefficient b0 and is then fed to the second summer 924b.

The output of the quantizer 926 generates a digitized signal of 33 levels and is fed to the PWM 928. The output of the PWM is then connected to the FIR filter 930. The output of the filter 930 defines the output of the DAC 920. For a more detailed explanation and discussion of such a DAC 920, reference is made to U.S. Pat. No. 7,116,721, entitled "Delta-Sigma Modulators With Integral Digital Low-Pass Filtering" and issued on Oct. 3, 2006, assigned to the same assignee as the present invention, which is hereby incorporated by reference in its entirety.

In FIG. 11, there is depicted a schematic circuit diagram of an implementation of one of the integrators 912a-912c of FIG. 9. The integrator 912 is formed of an operational amplifier 940, an input resistor 942, and a feedback capacitor 944. In FIG. 12, there is illustrated in block diagram form of a low-delay filter 950 formed of a plurality of series-connected biquad filter stages 952a, 952b, and 952c-952n suitable for use in the filter 836 of FIG. 8.

Figure 13:
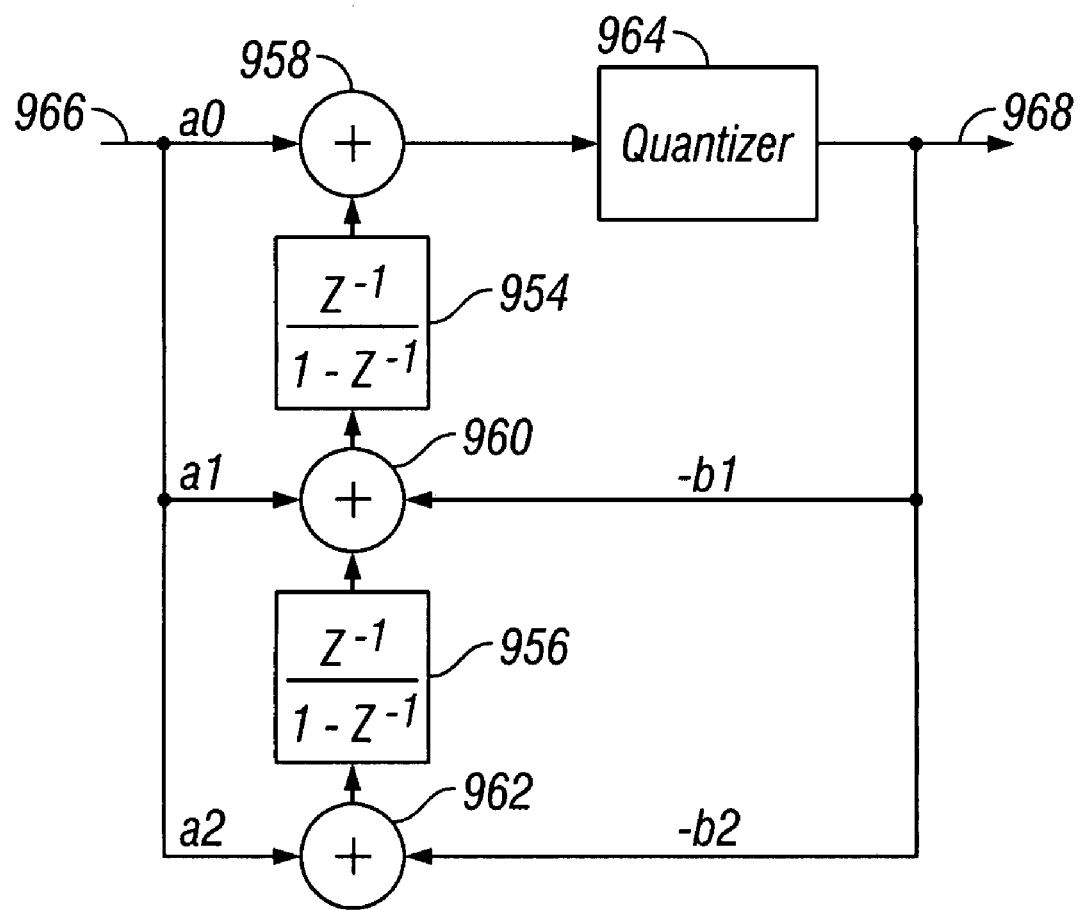
FIG. 13 is a schematic representation of an implementation of one of the biquad filter stages in FIG. 12.

In FIG. 13, there is shown a schematic representation of an implementation of one of the biquad filter stages 952a-952n of FIG. 12. The biquad filter stage 952 includes delaying integrator stages 954 and 956, associated summers 958-962, and a quantizer 964. The input on line 966 is multiplied by corresponding coefficients a0, a1, a2 before being fed to the respective summers 958-962. The output on line 968 from the quantizer 964 is multiplied by corresponding coefficients −b1, −b2 before being fed to the respective summers 960 and 962. The output of the summer 962 is fed to the input of the delaying integrator stage 956 having an output that is also fed to the summer 960. The output of the summer 960 is fed to the input of the delaying integrator stage 954 having an output that is also fed to the summer 958. For a more detailed explanation and discussion of such a biquad filter stage 952, reference is made to U.S. Pat. No. 7,062,340, entitled "Audio Data Processing Systems and Methods Utilizing High Oversampling Rates" and issued on Jun. 13, 2006, assigned to the same assignee as the present invention, which is hereby incorporated by reference in its entirety.

In FIG. 8A, there is illustrated in block diagram a second embodiment of a low-delay digital audio processing system 840 of the present invention for use in noise cancellation applications. The low-delay digital audio processing system 840 represents an improvement over the prior art digital processing system 76 of FIG. 4B. As can be seen, the digital audio processing system 840 includes a delta-sigma analog-to-digital converter (ADC) 842, a plurality of series-connected biquad filter stages 844a-844c, and a delta-sigma digital-to-analog converter (DAC) 846.

The ADC 842 receives analog audio signals and converts them to a digital sample signal 848 at a high sampling rate. The biquad filter stages 844a-844c operating as a low-delay digital filter operate at the high sampling rate and receives the digital sample signal. The output of the biquad filter stage 844c is fed to the DAC 846 which generates an analog audio signal on the output 850. This present digital audio processing system 840 has a low delay, which is substantially the same as in the analog processing system, but yet realizes higher accuracy and utilizes a lower amount of power.

From the foregoing detailed description, it can thus be seen that the present invention provides a low-delay signal processing system which includes a delta-sigma analog-to-digital converter, an oversampling processor, and a delta-sigma digital-to-analog converter. The delta-sigma analog-to-digital converter receives an input signal and generates a digital sample signal at a high oversampling rate. The oversampling processor is connected to the analog-to-digital converter for processing the digital sample signal at the high oversampling rate with low-delay. The delta-sigma digital-to-analog converter is connected to the oversampling processor for receiving the digital sample signal at the high oversampling rate with low-delay for generating an analog signal. The oversampling processor includes a low-delay filter and a programmable delay element. In this manner, the analog signal is produced with a low delay and high accuracy.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

The invention claimed is:

1. A low-delay audio data processing system comprising:
a first converter for converting sound into an audio signal;
a delta-sigma analog-to-digital converter for receiving the audio signal and for generating a digital sample signal at a high oversampling rate;
a decimation filter responsive to the digital sample signal at the high oversampling rate for generating a downsampled signal;
an audio data processor being connected to said decimation filter for processing the downsampled signal;
an interpolation filter responsive to the processed downsampled signal for generating an upsampled signal;
a delta-sigma digital-to-analog converter for receiving a compensated upsampled signal and for generating an analog signal;
a second converter for converting the analog signal into a sound signal;
an oversampling processor including a low-delay filter interconnected between said analog-to-digital converter and said digital-to-analog converter for processing the digital sample signal at the high oversampling rate with low-delay; and
a summer connected to said oversampling processor and to the output of said interpolation filter for generating the compensated upsampled signal.

2. A low-delay audio data processing system as claimed in claim 1, wherein the high oversampling rate is at least 16 times an audio sampling rate.

3. A low-delay audio data processing system as claimed in claim 1, wherein said oversampling processor further comprises a programmable delay element connected to the output of said low-delay filter.

4. A low-delay audio data processing system as claimed in claim 1, wherein said low-delay filter is formed of a plurality of series-connected second-order IIR filters.

5. A low-delay audio data processing system as claimed in claim 1, wherein said analog-to-digital converter comprises a feedforward analog-to-digital converter which is formed of a plurality of integrators and a quantizer.

6. A low-delay audio data processing system as claimed in claim 5, wherein said analog-to-digital converter is being operated at the high oversampling rate of at least 1.5 MHz.

7. A low-delay audio data processing system as claimed in claim 1, wherein said digital-to-analog converter comprises a plurality of integrators, a quantizer, a pulse-width modulator, and a FIR filter.

8. A low-delay audio data processing system as claimed in claim 1, wherein said first converter for converting the sound consists of a microphone.

9. A low-delay audio data processing system as claimed in claim 1, wherein said second converter for converting the analog signal consists of a speaker.

10. A low-delay signal data processing system comprising:
a delta-sigma analog-to-digital converter for receiving an audio signal and for generating a digital sample signal at a high oversampling rate;
oversampling processor including a low-delay filter connected to said analog-to-digital converter for processing the digital sample signal at the high oversampling rate with low-delay; and
a delta-sigma digital-to-analog converter connected to said oversampling processor for receiving the digital sample signal at the high oversampling rate with low-delay for generating an analog signal.

11. A low-delay signal processing system as claimed in claim 10, wherein said digital sample signal from said delta-sigma analog-to-digital converter is also fed to a decimation filter for generating a downsampled signal.

12. A low-delay signal processing system as claimed in claim 10, wherein said delta-sigma digital-to-analog converter also receives an unsampled signal from an interpolation filter.

13. A low-delay signal processing system as claimed in claim 10, wherein said low-delay filter is formed of a plurality of series-connected second-order IIR filters.

14. A low-delay signal data processing system as claimed in claim 10, wherein said analog-to-digital converter comprises a feedforward analog-to-digital converter which is formed of a plurality of integrators and a quantizer.

15. A low-delay signal processing system as claimed in claim 14, wherein said analog-to-digital converter is being operated at the high oversampling rate of at least 1.5 MHz.

16. A low-delay signal processing system as claimed in claim 10, wherein said digital-to-analog converter comprises a plurality of integrators, a quantizer, a pulse-width modulator, and a FIR filter.

17. A low-delay signal processing method comprising the steps of:
generating a digital sample signal at a high oversampling rate from a delta-sigma analog-to-digital converter;
processing the digital sample signal at the high oversampling rate through an oversampling processing path having a low-delay filter to produce a low-delay signal; and
receiving the low-delay signal in a delta-sigma digital-to-analog converter to convert the low-delay signal into an analog signal with low delay.

18. A low-delay signal processing method as claimed in claim 17, wherein the step of processing the digital sample signal at the high oversampling rate through the oversampling processing path includes processing the digital sample signal at the high oversampling rate through the oversampling processing path having a programmable delay element connected to the output of the low-delay filter.

19. A low-delay signal processing method as claimed in claim 17, wherein the step of processing the digital sample signal at the high oversampling rate through the oversampling processing path includes processing the digital sample signal at the high oversampling rate through the oversampling processing path having a plurality of series-connected second-order IIR filters.

20. A low-delay signal processing method as claimed in claim 17, wherein the step of generating the digital sample signal at the high oversampling rate includes the step of oversampling at least 16 times an audio sampling rate.

21. A low-delay audio data processing system as claimed in claim 4, wherein each of said plurality of series-connected second-order IIR filters comprises an integrator.

22. A low-delay signal processing system as claimed in claim 13, wherein at least one of said plurality of series-connected second-order IIR filters comprises an integrator.

23. A low-delay signal processing method as claimed in claim 19, wherein at least one of said plurality of series-connected second-order IIR filters comprises an integrator.

24. A low-delay headphone system comprising:
a microphone for converting sound into an audio signal;
a delta-sigma analog-to-digital converter for receiving said audio signal and for generating a digital sample signal at a high oversampling rate;
an oversampling processor including a low-delay filter connected to said analog-to-digital converter for processing said digital sample signal at the high oversampling rate with low-delay;
a delta-sigma digital-to-analog converter connected to said oversampling processor for receiving said digital sample signal at the high oversampling rate with low-delay for generating an analog signal; and
a speaker for converting said analog signal into a sound signal.

25. A low-delay portable audio player adapted to be connected to a headphone and a microphone, said audio player comprising:
the microphone being used to convert sound into an audio signal;
a delta-sigma analog-to-digital converter for receiving said audio signal and for generating a digital sample signal at a high oversampling rate;
an oversampling processor including a low-delay filter connected to said analog-to-digital converter for processing said digital sample signal at the high oversampling rate with low-delay;
a delta-sigma digital-to-analog converter connected to said oversampling processor for receiving said digital sample signal at the high oversampling rate with a low-delay for generating an analog signal; and
a speaker disposed in the headphone for converting said analog signal into a sound signal.

* * * * *

UNITED STATES PATENT AND TRADEMARK OFFICE
CERTIFICATE OF CORRECTION

PATENT NO. : 7,365,669 B1 Page 1 of 2
APPLICATION NO. : 11/692906
DATED : April 29, 2008
INVENTOR(S) : John L. Melanson It is certified that error appears in the above-identified patent and that said Letters Patent is hereby corrected as shown below:

Title page illustrating a Fig. should be deleted and substituted with new title page illustrating a Fig. (Attached)

Signed and Sealed this

Twenty-fifth Day of May, 2010

David J. Kappos
*Director of the United States Patent and Trademark Office*

CERTIFICATE OF CORRECTION (continued) Page 2 of 2

United States Patent
Melanson

(10) Patent No.: US 7,365,669 B1
(45) Date of Patent: Apr. 29, 2008

(54) LOW-DELAY SIGNAL PROCESSING BASED ON HIGHLY OVERSAMPLED DIGITAL PROCESSING

(75) Inventor: John L. Melanson, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 11/692,906

(22) Filed: Mar. 28, 2007

(51) Int. Cl.
  *H03M 3/00* (2006.01)
(52) U.S. Cl. .................... 341/143; 381/312
(58) Field of Classification Search ............. 341/143, 341/144, 155; 381/312
  See application file for complete search history.

(56) References Cited

U.S. PATENT DOCUMENTS

| | | | |
|---|---|---|---|
| 5,241,310 A * | 8/1993 | Tiemann | 341/143 |
| 6,249,237 B1 * | 6/2001 | Prater | 341/143 |
| 6,937,738 B2 * | 8/2005 | Armstrong et al. | 381/312 |

* cited by examiner

*Primary Examiner*—Jean B Jeanglaude
(74) *Attorney, Agent, or Firm*—Davis Chin; Steven Lin; Gregory S. Thomas

(57) ABSTRACT

A low-delay signal processing system and method are provided which includes a delta-sigma analog-to-digital converter, an oversampling processor, and a delta-sigma digital-to-analog converter. The delta-sigma analog-to-digital converter receives an input or audio signal and generates a digital sample signal at a high oversampling rate. The oversampling processor is connected to the analog-to-digital converter for processing the digital sample signal at the high oversampling rate with low-delay. The delta-sigma digital-to-analog converter is connected to the oversampling processor for receiving the digital sample signal at the high oversampling rate with low-delay for generating an analog signal. The oversampling processor includes a low-delay filter and a programmable delay element. In this manner, the analog signal is produced with a low delay and high accuracy.

25 Claims, 9 Drawing Sheets

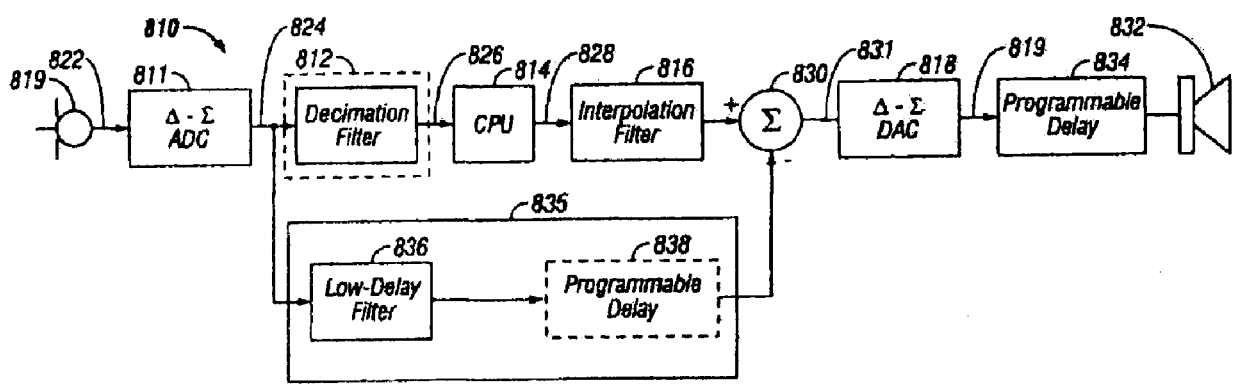

UNITED STATES PATENT AND TRADEMARK OFFICE
CERTIFICATE OF CORRECTION

| | |
|---|---|
| PATENT NO. | : 7,365,669 B1 |
| APPLICATION NO. | : 11/692906 |
| DATED | : April 29, 2008 |
| INVENTOR(S) | : John L. Melanson |

It is certified that error appears in the above-identified patent and that said Letters Patent is hereby corrected as shown below:

In Column 2, line 32, the word "if" should be changed to -- is --; and

In Column 9, line 26, the word "unsampled" should be changed to -- upsampled --.

Signed and Sealed this

Twenty-fourth Day of August, 2010

David J. Kappos
*Director of the United States Patent and Trademark Office*